(12) United States Patent
Kuo

(10) Patent No.: US 6,317,016 B1
(45) Date of Patent: Nov. 13, 2001

(54) METHOD AND ARRANGEMENT FOR GYRATION FILTERING WITH LOW POWER CONSUMPTION

(75) Inventor: Timothy C. Kuo, Milpitas, CA (US)

(73) Assignee: Koninklijke Philips Electronics, Eindhoven (NL)

(*) Notice: Subject to any disclaimer, the term of this patent is extended or adjusted under 35 U.S.C. 154(b) by 0 days.

(21) Appl. No.: 09/312,132

(22) Filed: May 14, 1999

(51) Int. Cl.[7] .............................. H03H 7/00; H03H 11/00
(52) U.S. Cl. ......................... 333/215; 333/167; 333/168
(58) Field of Search .................................. 333/213, 214, 333/215, 216, 217, 167, 168

(56) References Cited

U.S. PATENT DOCUMENTS

| | | |
|---|---|---|
| 4,823,092 | 4/1989 | Pennock . |
| 4,914,408 * | 4/1990 | Voorman ............................. 333/167 |
| 5,015,966 | 5/1991 | McIntyre . |
| 5,392,003 | 2/1995 | Nag et al. . |
| 5,457,426 | 10/1995 | Brehmer . |
| 5,699,016 * | 12/1997 | Federspiel et al. .................. 330/260 |

FOREIGN PATENT DOCUMENTS

| | | |
|---|---|---|
| 0 493 335 A1 | 12/1991 | (IT) . |
| 1-126811 | 11/1987 | (JP) . |

OTHER PUBLICATIONS

Mihai Banu et al., "Fully Differential Operational Amplifiers with Accurate Output Balancing," IEEE Journal of Solid-State Circuits, vol. 23, No. 6, Dec. 1988, pp. 1410–1414.

Tat C. Choi et al., "High–Frequency CMOS Switched–Capacitor Filters for Communications Application," IEEE Journal of Solid–State Circuits, vol. SC–18, No. 6, Dec. 1983, pp. 652–664.

(List continued on next page.)

Primary Examiner—Robert Pascal
Assistant Examiner—Kimberly E Glenn (57) ABSTRACT

An arrangement of differential amplifying-type gyrators is used to implement a signal-filtering circuit with significantly reduced power consumption. One specific example implementation is directed to a signal-filtering circuit arrangement that uses a gyrator-type signal-filtering circuit to simulate a multiple-section LC ladder implementation. A plurality of transconductance cells are arranged to simulate the first inductance ladder section and at least one subsequent inductance ladder section. The first inductance ladder section is adapted to provide a gain of two or three. By setting the gain of the first section in this manner, the noise contribution of the subsequent sections is significantly lessened relative to the conventional implementation in which the gain of the first section is unity. Further, each of the first and subsequent inductance ladder sections has at least one associated capacitance value scaled to accommodate a feed-forward and feedback path through transconductance cells and each has at least one associated transconductance value scaled to accommodate impedance level and signal amplitude of the circuit arrangement. The present invention is especially advantageous for low-power IC applications. Another aspect of the present invention modifies the above arrangement by sharing common mode feedback between transconductance cells with shared outputs, and is especially advantageous for low-power IC applications, such as CDMA IS95, where superior filter linearity and stopband rejection are required.

20 Claims, 6 Drawing Sheets

OTHER PUBLICATIONS

J. F. Duque–Carrillo et al., "A Family of Bias Circuits for High Input Swing CMOS Operational Amplifiers," 1992 IEEE International Symposium on Circuits and Systems, Sheraton Hotel, San Diego, California, May 10–13, 1992, vol. 6 of 6, pp. 3021–3024.

Venugopal Gopinathan et al., "Design Considerations for High–Frequency Continuous–Time Filters and implementation of an Antialiasing Filter for Digital Video," IEEE Journal of Solid–State Circuits, vol. 25, No. 6, Dec. 1990, pp. 1368–1378.

Venugopal Gopinathan et al., "A 5V $7^{th}$ –order Elliptic Analog Filter for Digital Video Applications," 1990 IEEE International Solid–State Circuits Conference, Feb. 16, 1990, Continental Ballroom, Session 12.

K. Halonen et al., "A 3V gmC–Filter with On–Chip Tuning for CDMA," CICC'97 Conf., San Diego, CA, 1997, pp. 83–86.

J. Haspeslagh and W. Sansen, "Design Techniques for Fully Differential Amplifiers," IEEE 1988 Custom Integrated Circuits Conference, pp. 12.2.1–12.2.4.

G.M. Jacobs et al., Design Techniques for MOS Switched Capacitor Ladder Filters, IEEE Trans. Circuits System, vol. CAS–25, No. 12, Dec. 1978.

H. Khorramabadi et al., "Baseband Filters for IS–95 CDMA Receiver Applications Featureing Digital Automatic Frequency Tuning," ISSCC'96 Conf., San Francisco, CA, Feb. 1996, pp. 172–173.

F. Krummenacher and G. Van Ruymekke, "Integrated Selectivity for Narrow–Band FM IF Systems," IEEE Journal of Solid–State Circuits, vol. 25, No. 3, Jun. 1990, Special Correspondence, pp. 757–760.

Yun–Ti Wang and Asad A. Abidi, "CMOS Active Filter Design at Very High Frequencies," IEEE Journal of Solid-State Circuits, vol. 25, No. 6, Dec. 1990, pp. 1562–1574.

* cited by examiner

METHOD AND ARRANGEMENT FOR GYRATION FILTERING WITH LOW POWER CONSUMPTION

RELATED PATENT DOCUMENTS

The present invention is being filed concurrently with U.S. patent application Ser. No. 09/311,447, which is entitled, "Method and Arrangement for Filtering with Common Mode Feedback for Low Power Consumption" (VLSI.239PA), assigned to the instant assignee and incorporated herein by reference in its entirety.

FIELD OF THE INVENTION

The present invention relates generally to filters of the type involving transconductance amplifier stages that employ field effect transistors and, more particularly, to the implementation of inductor-simulating gyrator-type filters in a manner that significantly reduces power consumption.

BACKGROUND OF THE INVENTION

The communications industry continues to rely upon advances in semiconductor technology to realize higher-functioning devices serving an increasingly complex communication spectrum. For many applications, realizing higher-functioning devices requires the transmission and reception of signals in potentially noisy environments. At the reception end of such communication, recovering the transmitted signal with a high degree of integrity typically requires filtering the analog signal. Preferably, this filtering occurs before significant amplification of the received signal.

Due to its low sensitivity to noise, signal filtering is often achieved using passive filters based on an LC (inductance/capacitance) ladder approach. Designing this type of passive filter, however, is problematic due to an incompatibility of integrating inductors with conventional circuit integration structures and processes. To overcome this dilemma, the conventional inductor has been replaced in many applications with an inductor-simulating electronic component called a gyrator. Gyrators are typically constructed using transistors and capacitors, each of which is fully compatible with conventional circuit integration structures and processes, In many applications, these signal filters are also required to manifest a linear response within the bandwidth, a precisely-defined stopband rejection, and, in some instances, programmability (tunability) within the bandwidth. In defining filter performance, each of these important aspects has been partially realized using Operational Transconductance Amplifiers (OTAs). OTAs are typically implemented using the gyrator design in a differential amplifier configuration. The programmability of the OTA is addressed by varying its transconductance, which is directly proportional to the bandwidth characteristics and inversely proportional to the capacitance.

For many filters requiring or benefiting from gyrators of this differential-transconductance type, precisely controlling the common mode voltage of the transconductance stages is important. This is particularly true for certain channel select filters such as the channel filter recommended in CDMA IS95, where filter performance should comply with stringent filter linearity and stopband rejection criteria. Gyrators of this differential amplifier type provide a somewhat balanced output having a common mode voltage (or difference potential) that is a function of potentials of nodes in the vicinity of the output nodes. However, because these potentials are difficult to control, an intolerable variation of the common mode voltage can result, which in turn leads to variation in conductance value and thus variation of the cutoff frequencies. Moreover, to satisfy stringent filter linearity criteria, it is important that the operating frequency range be widely defined and not fluctuate.

These difficulties in such differential amplifier gyrator circuits have been partly overcome by common mode feedback (CMFB) implemented as part of gyrator circuits to maintain the common mode voltage within a reasonable range. In one implementation, for example, relatively balanced outputs are provided by merging the CMFB and the differential gain paths to improve accuracy in the balancing of the output. The above-referenced patent document provides further information on this type of circuit as well as related implementations.

Another significant concern in attempting to realize an effectively-performing filter in an integrated-circuit package is excessive power consumption. Although active RC (resistor-capacitor) filters can be readily implemented to achieve dynamic range scaling with low power consumption and low noise performance, unlike differential amplifier gyrator circuits, RC filters are sensitive to process variation and therefore not typically suitable for production using conventional MOS-based processing techniques.

Differential amplifier gyrator circuits that simulate LC ladder circuits are more advantageous because they realize excellent sensitivity performance and, as addressed above, can be readily implemented for production using conventional MOS-based processing techniques. For many applications, however, power consumed by differential amplifier gyrator circuits is excessive. Among others, these applications include handheld devices such as those to be used for communication in compliance with CDMA IS95.

Accordingly, for many filter applications, there are opposing tensions in the goals of realizing IC-compatibility and excellent sensitivity performance and the goal of signal-filtering without excessive power consumption. The present invention addresses implementations and methods for realizing signal-filtering by way of differential amplifier gyration without excessive power consumption, for CDMA IS95 type communication and other applications that require and benefit from IC-compatible signal-filtering with excellent sensitivity performance and low power consumption.

SUMMARY

According to various aspects of the present invention, embodiments thereof are exemplified in the form of methods and arrangements for reducing power consumption in gyrator-type signal filtering involving differential amplifying-type filters. Such embodiments are useful in connection with integration of such filters as part of IC applications.

One specific implementation is directed to a signal-filtering circuit arrangement, comprising an arrangement of differential amplifying-type gyrators simulating LC ladder sections with the first of the LC ladder sections simulated to provide a gain of two to significantly reduce noise contributions in the subsequent ladder sections and thereby reduce overall power consumption.

In another example implementation, the present invention is directed to a gyrator-type signal-filtering circuit arrangement, comprising a plurality of transconductance cells arranged to simulate at least a first inductance ladder section and a second inductance ladder section. The first inductance ladder section is adapted to provide a gain of at least two, and each of the first and second inductance ladder sections has at least one associated capacitance value scaled to accommodate a feed-forward and feedback path. Further, each of the first and second inductance ladder sections has at least one associated transconductance value scaled to accommodate the impedance level and signal amplitude of the circuit arrangement.

Another specific example implementation is directed to a signal-filtering circuit arrangement that uses a gyrator-type signal-filtering circuit to simulate a multiple-section LC ladder implementation. A plurality of transconductance cells are arranged to simulate the first inductance ladder section and at least one subsequent inductance ladder section. The first inductance ladder section is adapted to provide a gain of two or three. By setting the gain of the first section in this manner, the noise contribution of the subsequent sections is significantly lessened relative to the conventional implementation in which the gain of the first section is unity. Further, each of the first and subsequent inductance ladder sections has at least one associated capacitance value scaled to accommodate a feed-forward and feedback path through transconductance cells, and each has at least one associated transconductance value scaled to accommodate impedance level and signal amplitude of the circuit arrangement. The present invention is especially advantageous for low-power IC applications.

Another aspect of the present invention modifies the above arrangement by sharing common mode feedback between transconductance cells with shared outputs and is especially advantageous for low-power IC applications, such as CDMA IS95, where superior filter linearity and stopband rejection are required.

In yet another embodiment, a gyrator-type signal-filtering circuit arrangement comprises a plurality of transconductance cells and a common mode feedback circuit. The plurality of transconductance cells is arranged to simulate at least a first inductance ladder section and a second inductance ladder section, with the first inductance ladder section adapted to provide a gain of at least two. The plurality of transconductance cells includes at least one pair of transconductance cells with shared differential output ports, and each of the transconductance cells in the pair includes a common mode feedback input port. The common mode feedback circuit has differential inputs coupled to the shared differential output ports of the pair of transconductance cells and has a common mode feedback output coupled to the common mode feedback input port of each of the transconductance cells in the pair. In this manner, the common mode feedback circuit is shared by each of the transconductance cells in the pair.

The above summary is not intended to provide an overview of all aspects of the present invention. Other aspects of the present invention are directed to alternative arrangements and methods, as are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention is believed to be applicable to a variety of amplifiers and filters of the type involving transconductance stages. Embodiments of the present invention are believed to be particularly advantageous in integrated circuit (IC) designs involving MOS-type transistors; however, the invention is also thought to be applicable to other similar technologies, including but not limited to field effect transistor types. While the present invention is not necessarily so limited, an appreciation of the invention may be obtained through a discussion of one or more example applications in such environments.

In one example application, the present invention is directed generally to a channel select filter, such as the channel filter recommended in CDMA IS95. Channel select filters of this type have stringent filter linearity and stopband rejection criteria and, typically, consume significant amounts of power. For details concerning the filter linearity and stopband rejection criteria, reference may be made to the IS95 and IS98 CDMA recommendations for digital cellular communications.

Figure 1:
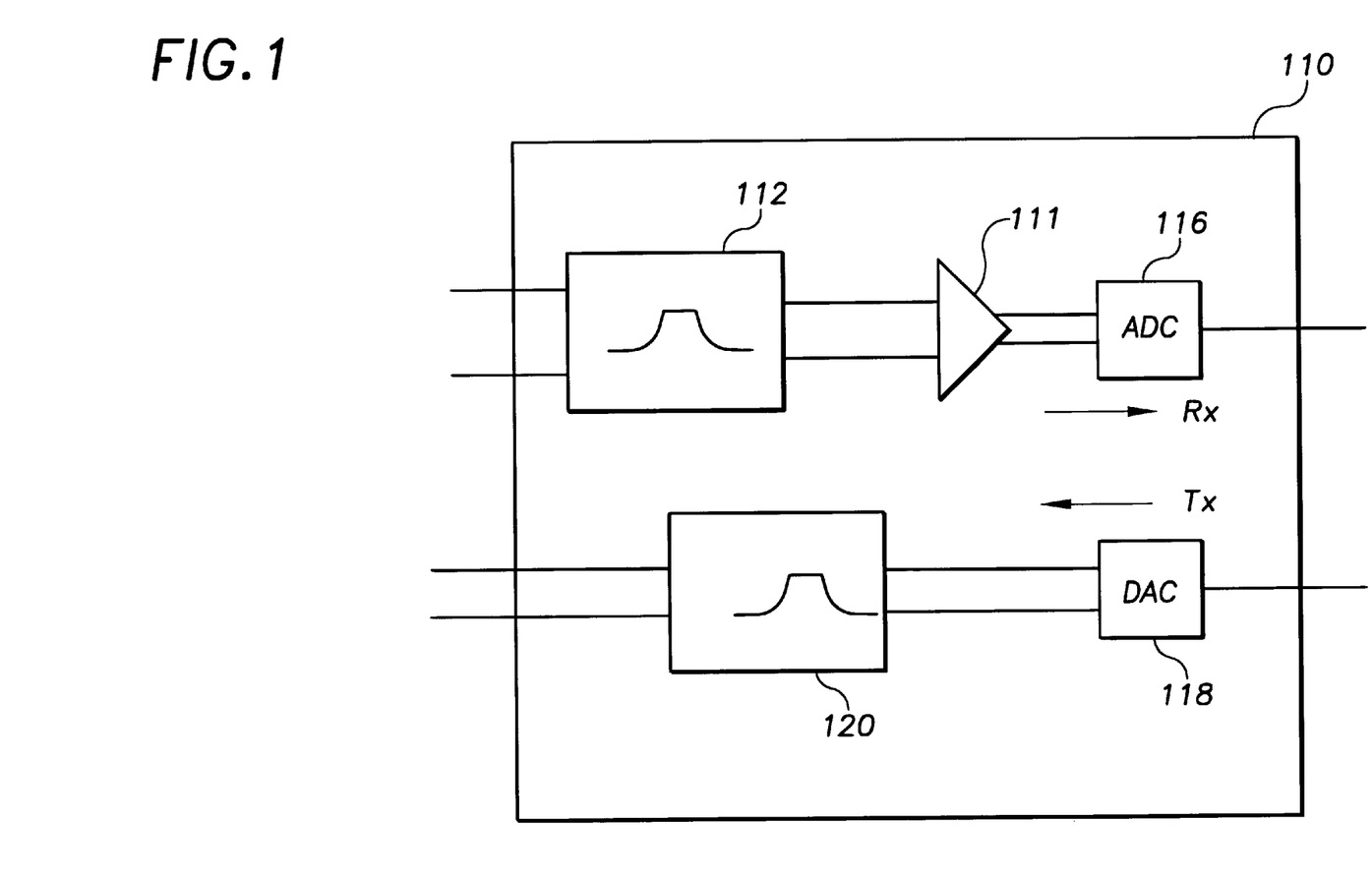
FIG. 1 illustrates a signal-filtering circuit arrangement as part of an integrated circuit design, according to an example application and embodiment of the present invention.

According to the present invention, FIG. 1 illustrates an example embodiment of a channel select filter in an integrated circuit (IC) chip 110 that is adapted to consume relatively low levels of power. For the type of cellular application mentioned above, the channel select filter depicted in FIG. 1 consumes about 2–3 times less power than would be expected if a more conventional construction were used.

The IC chip 110 of FIG. 1 is shown to include a receive path along the upper portion and a transmit path along the lower portion of the IC chip 110. The circuitry blocks depicted in the receive path include a signal filter 112 arranged as a lowpass filter, an amplifier 114, and an analog-to-digital converter (ADC) 116. The signal filter 112 is used as the above-mentioned channel select filter in the example application, for passing signals in the applicable cellular frequency band selected by the particular design of the signal filter 112. The input signal received by the signal filter 112, in one particular implementation, is provided by an intermediate frequency (IF) demodulator (not shown). The signal filter 112, designed in accordance with the present invention, passes signals in the applicable frequency band with adequately precise linearity and stopband rejection to satisfy the requirements set forth in the above-referenced CDMA IS-95 and IS-98 recommendations. The amplifier 114 amplifies the filtered signals passed by the signal filter 112, as is conventional, and the ADC 116 converts these signals to digital form for subsequent signal processing by a signal processor arrangement (not shown).

The circuitry blocks depicted in the transmit path include a conventional digital-to-analog converter (DAC) 118, adapted to convert digital signals provided by the signal processor arrangement into analog form for transmission, and a signal filter 120. The signal filter 120 is also arranged as a lowpass filter and can be constructed in the same manner as the signal filter 112 for passing signals in the applicable cellular frequency band selected by the particular design of the signal filter 112. The signal filter 112 passes the filtered signals to the IF modulator mentioned above.

As discussed above, signal filtering is often achieved using passive filters based on an LC ladder approach. To overcome problems relating to incompatibility of integrating inductors with conventional circuit integration structures and processes, it is useful to implement the inductance element using an inductor-simulating gyrator, which is fully compatible with conventional circuit integration structures and processes.

Figure 2A:
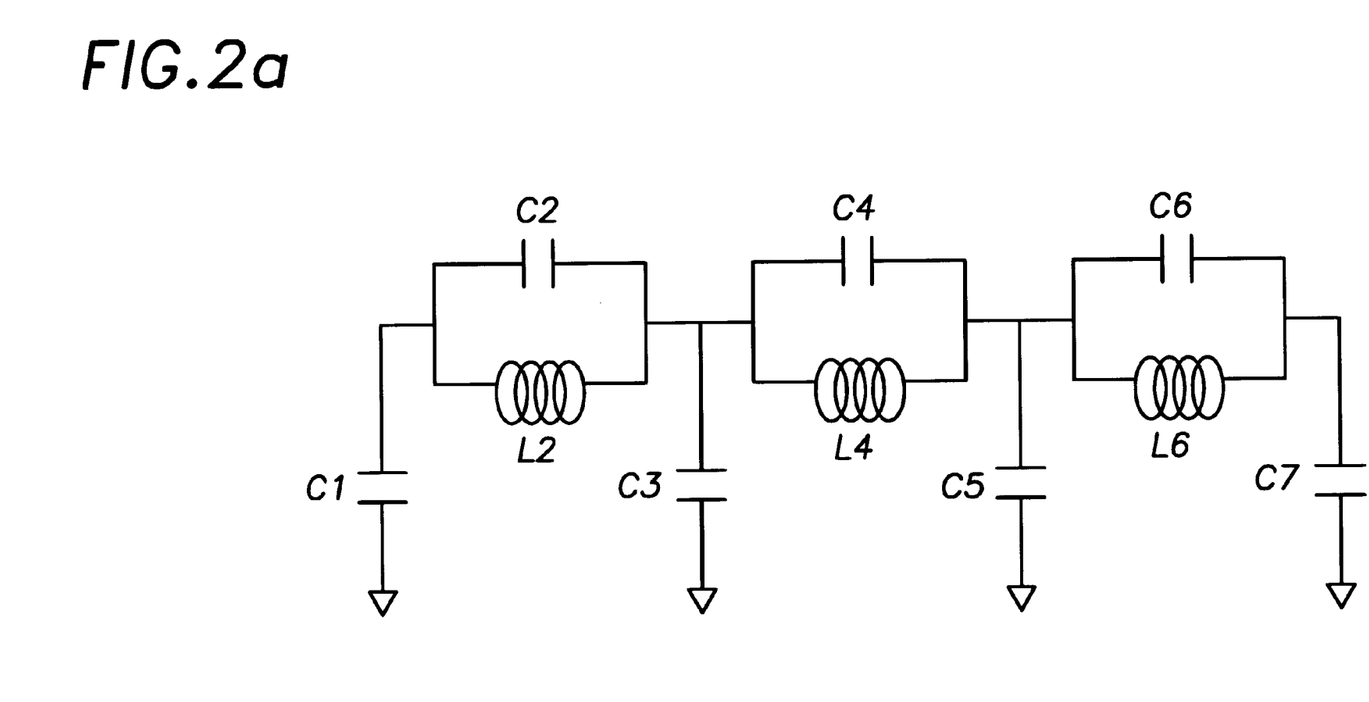
FIG. 2a illustrates an LC ladder-type filter, according to the prior art.
Figure 2B:
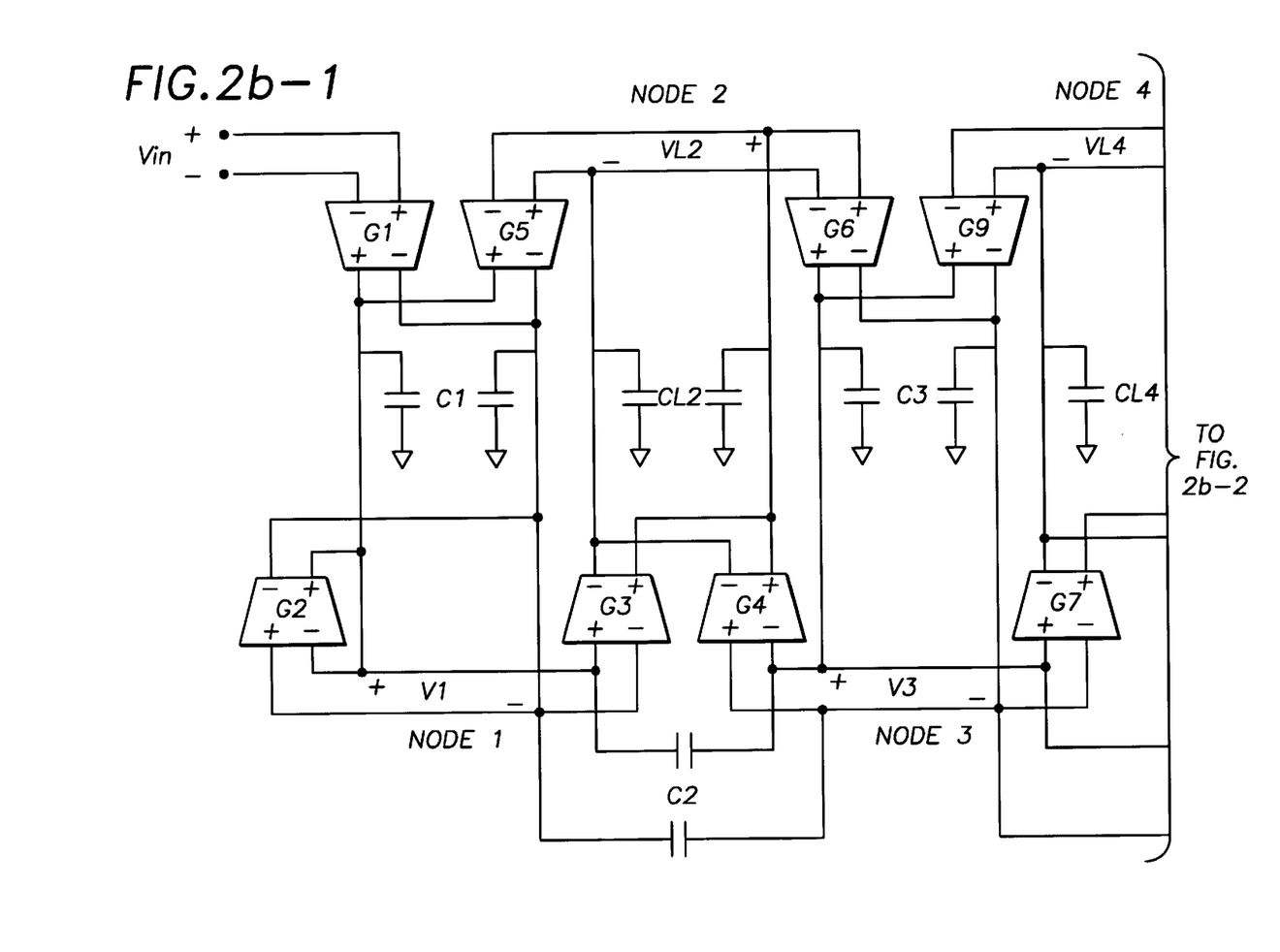
FIG. 2b illustrates a circuit of the signal-filtering circuit arrangement of FIG. 1 and consistent with the ladder sections depicted in FIG. 2a, according to a specific example embodiment of the present invention.
Figure 2B:
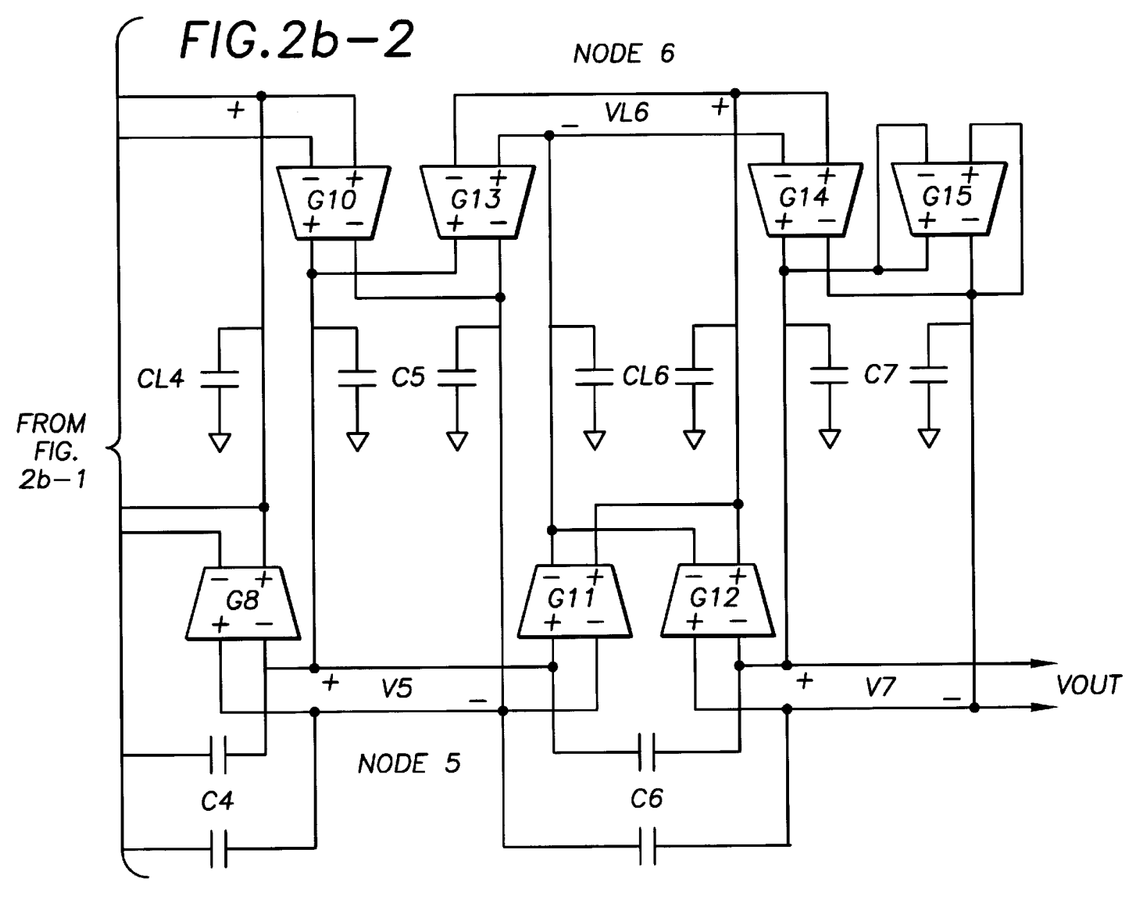

According to one example embodiment, signal filtering is achieved using a gyrator-type signal-filtering circuit simulating an LC ladder implementation such as the LC ladder implementation shown in FIG. 2a. In this example embodiment, a plurality of transconductance cells are arranged to simulate the first inductance ladder section and at least one subsequent inductance ladder section. In one embodiment, the first inductance ladder section is adapted to provide a gain of two, and in another embodiment, the first inductance ladder section is adapted to provide a gain of three. For convenience in terms of component implementation, the gain is selected as an integer value of at least two. By setting the gain of the first section in this manner, the noise contribution of the subsequent sections is significantly lessened relative to the conventional implementation in which the gain of the first section is unity. Further, each of the first and subsequent inductance ladder sections has at least one associated capacitance value scaled to accommodate a feed-forward and feedback path through transconductance cells and each has at least one associated transconductance value scaled to accommodate impedance level and signal amplitude of the circuit arrangement.

FIG. 2b illustrates another more specific example gyrator-based signal filter 200, for an LC ladder implementation such as shown in FIG. 2a of the signal-filter 112 and/or 120 of FIG. 1, according to the present invention.

In the example arrangement illustrated, the gyrator-based signal-filter 200 includes a plurality of transconductance cells G1–G15, and a plurality of capacitors C1–C7 and CL2, CL4 and CL6. The gyrator-based signal-filter 200 implements an LC ladder filter with three inductors represented by three gyrator-capacitor arrangements. The three gyrator-capacitor arrangements respectively correspond to the three LC ladder filter sections of FIG. 2a. For example, $G_3$, $G_4$, $G_5$, $G_6$ together with $C_{L2}$ form an inductor with its value given by the formula: $L_2 = C_{L2}/gm^2$, where gm is the transconductance value of $G_3$–$G_6$. Similarly, $L_4 = C_{L4}/gm^2$ and $L_6 = C_{L6}/gm^2$.

In a particular conventional approach that does not adequately address the above-mentioned power-consumption concerns, in an arrangement of gyrators similar to that illustrated in FIG. 2b, all the transconductors have same transconductance value, gm. Thus, the filter impedance level is 1/gm. The actual element value is scaled by the impedance level as well as by the filter cutoff frequency $f_0$. In other words, the actual inductor value $L_{2,4,6} = L_{20,40,60}/(gm*2\partial f_0)$, where $L_{20,40,60}$ are the normalized inductor values from the standard filter design table. By applying the equation given above, the following component value is determined as: $C_{L2,L4,L6} = (gm*L_{20,40,60})/(2\partial f_0)$, where $C_{10-70}$ are the normalized capacitor values from the standard filter design table.

Conventional design equations for implementing the gyrator filter are summarized as:

$$G_1 - G_{15} = gm$$

$$C_1, C_3, C_5, C_7 = \frac{C_{i0} * gm}{2\pi f_0}$$

$$C_2, C_4, C_6 = \frac{C_{i0} * gm}{2\pi f_0}$$

$$C_{L2}, C_{L4}, C_{L6} = \frac{L_{i0} * gm}{2\pi f_0}$$

where gm is the transconductance value, $f_0$ is the filter cutoff frequency, $C_I$ is the actual capacitor value implemented, and $C_{i0}$, $L_{i0}$ is the normalized element value from standard filter table. For additional information concerning conventional implementations for a gyrator-based signal-filter, reference may be made to the following articles: H. Khorramabadi, M. J. Tarsia, N. Woo, *Baseband Filters for IS-95 CDMA Receiver Applications Featuring Digital Automatic Frequency Tuning*, ISSCC'96 Conf., San Francisco, Calif., February 1996, pp. 172–173; K. Halonen, S. Lindfors, J. Jussila, L. Siren, *A3V gmC-Filter with On-Chip Tuning for CDMA*, CICC'97 Conf., San Diego, Calif., 1997, pp. 83–86; and G. M. Jacobs, D. J. Allstot, P. R. Gray, *Design Techniques for MOS Switched Capacitor Ladder Filters*, IEEE Trans. Circuits System, Vol. CAS-25, No. 12, December 1978.

Unlike the above conventional approach, the example gyrator-based signal-filter 200 of FIG. 2b addresses power-consumption concerns by reducing the filter noise. An important aspect of the present invention concerns the recognition that power consumption of a gyrator-based signal-filter is largely limited by noise and distortion performance. By significantly reducing the filter noise, power consumed by the filter is significantly reduced.

Suppressing noise by applying dynamic range scaling is problematic when attempting to achieve sharp transitions in the filter response. While elliptic filters generally provide for sharper transitions, elliptic filters involve transmission zeros which introduce cross capacitors; cross capacitors, in turn, make impedance scaling troublesome because they create both feedforward and feedback paths in the circuit.

According to an example implementation of the present invention, this problem is addressed using a conventional signal-flow graph methodology to design an active-ladder network, consistent with the network of FIG. 2b, with a gain of two (2) in the first section. More specifically, the differential equations describing the network are transformed into a pictorial representation (referred to as a flow diagram) that contains nodes for both voltage and current variables in the circuit or network. The node-connecting branches represent the transfer functions of each circuit element, with the overall mathematical representation being manipulated to realize an implementation corresponding to a switched capacitor circuit. Once the proper flow diagram is constructed, the transformation into a particular filter capacitor circuit easily follows. For the low-pass ladder filter of FIG. 2b with finite transmission zeros, certain modifications are typically employed, for example, as discussed with such signal-flow graph methodology in the article by G. M. Jacobs, D. J. Allstot, P. R. Gray, entitled "Design Techniques for MOS Switched Capacitor Ladder Filters," IEEE Trans. Circuits System, Vol. CAS-25, No. 12, December 1978.

With a gain of two in the first section of the low-pass ladder filter of FIG. 2b, each of $V_3$, $V_5$ and $V_7$ is twice as much as $V_1$. With this gain, the noise contribution from later transconductors is greatly reduced and a significant contribution toward reducing power consumption is realized.

In the signal-flow design of the low-pass ladder filter of FIG. 2b, component values are scaled using two steps. First, capacitors are scaled. To satisfy both feed-forward and feedback path (via G3, G4, V3, G7, G8, V5, G11, G12) after 2-times scaling, the following equations are satisfied:

$$\frac{C_2}{C_1 + C_2} \rightarrow 0.5 * \text{original value} \quad 1)$$

$$\frac{C_2}{C_2 + C_3 + C_4} \rightarrow 2 * \text{original value} \quad 2)$$

Keeping the impedance at node 3 unchanged is advantageous and convenient in solving the above equations. This results in the following capacitor scaling:

$C'_1 = 4C_1 + 2C_2$ $C'_2 = 2C_2$ $C'_3 = C_3 - C_2$ $C'_{L2} = 2C_{L2}$ where the left hand side is the new component value and the right hand side is the conventional component value.

Second, to accommodate the changed impedance level and signal amplitude, transconductance values are scaled. Impedance at node 3 does not change; however, the signal amplitude doubles. Therefore, the transconductance value at gm6 is doubled. Impedance level at node 1 is 4 times smaller; therefore, the transconductance values at gm1, gm2, gm5 are 4 times larger. Impedance level at node L2 is 2 times smaller while the signal amplitude does not change; therefore, the transconductance value gm3 is doubled.

The following equations summarize the implementation of the impedance scaling for this example implementation:

gm1'=8*gm gm2'=4*gm gm3'=2*gm gm5'=4*gm gm6'=2*gm all other transconductances are set as gm

C1'=4C1+2C2

C2'=2C2

C3'=C3−C2

CL2'=2CL2, where Ci are the capacitor value from the above-discussed conventional approach A conventional approach would require sixteen transconductor cells to implement the filter. If each transconductor cell were to have an input-referred noise of $v_n^2$, the overall filter noise power is $4v_n^2$. On the other hand, the above-discussed implementation employs thirty transconductor cells. However, the input-referred noise of the filter has been lowered to $(9/8) v_n^2$. Since noise power is inversely proportional to transconductance, to maintain the same filter noise floor, which is $4v_n^2$, only 8.4 transconductor cells are required. The overall filter power consumption is proportional to the number of the transconductor used; accordingly, therefore, in this example, the proposed method saves filter power by a factor of forty-eight percent.

In terms of benefits of noise/power performance, particular embodiments of the present invention have realized, for the same noise level, filter power savings of forty-eight percent. Further, as mentioned above, an important advantage of using the above-characterized type of ladder filter is superior sensitivity to component variation. In particular embodiments of the above-characterized filters, sensitivity performance was maintained after scaling for the following specifications:

|  | Mean | Std |
|---|---|---|
| Scaled Version |  |  |
| Low frequency gain (dB) | 6.0053 | 0.3026 |
| Attenuation at 630 kHz (dB) | 0.2175 | 0.1923 |
| Attenuation at 900 kHz (db) | 72.192 | 8.5359 |
| 3dB cutoff frequency (kHz) | 695.23 | 4.5489 |
| Non-scaled Version |  |  |
| Low frequency gain (dB) | −0.0181 | 0.3026 |
| Attenuation at 630 kHz (dB) | 0.2193 | 0.1923 |
| Attenuation at 900 kHz (dB) | 72.191 | 8.5357 |
| 3dB cutoff frequency (kHz) | 695.20 | 4.5512 |

The above data assumes: capacitor variation is at about two percent, and tranconductance variation is about five percent.

According to an optional aspect and specific implementation of the present invention, control of the common mode voltage of the gyrator (or transconductance cell) can be realized to significantly improve filter linearity and stopband rejection. In particular embodiments, this is accomplished by sampling the common mode voltage while minimizing loading of the transconductance cell. This can be best understood by referring to the example transconductance cell of FIG. 3, which has differential input and output sets that map directly to each of the differential input and output sets of the gyrators G1–G15 of FIG. 2b.

Figure 3:
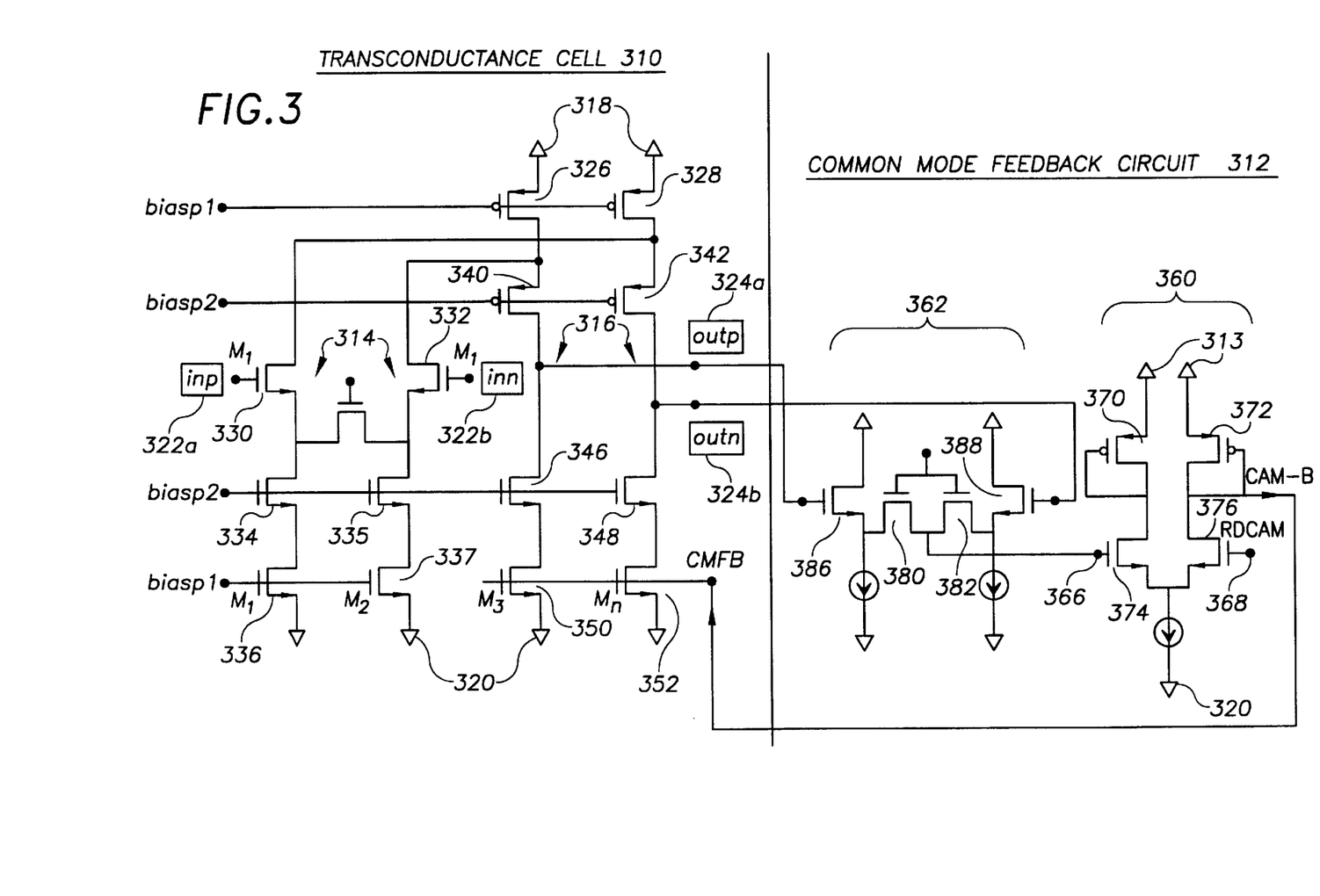
FIG. 3 illustrates an example circuit arrangement including a transconductance cell with common mode feedback for implementing a portion of the signal-filtering circuit arrangement illustrated in FIGS. 1 and 2, according to another aspect of the present invention.

The example transconductance cell of FIG. 3 includes a transconductance cell 310 and a common mode feedback circuit 312. The transconductance cell 310 has two pairs of current paths 314 and 316 passing current from a power source terminal 318 to a power drain terminal 320. The current paths 314 and 316 respectively provide a differential input port at terminals 322a (positive) and 322b (negative), and a differential output port at terminals 324a (positive) and 324b (negative). The current paths 314 and 316 share PMOS transistors 326 and 328, which are respectively biased at a selected voltage for the particular application and design, as is conventional. The current path 314 further includes: NMOS transistors 330 and 332 having their respective gates driven by the differential input signals, and NMOS transistors 334–337 having their respective gates biased at other selected voltages, as above for the transistors 326 and 328.

An NMOS transistor 338 is used to control the transconductance value by varying the gate voltage Vc. The current path 316 further includes: PMOS transistors 340 and 342 having their respective gates driven by a particularly selected voltage, NMOS transistors 346 and 348 having their respective gates biased at the same selected voltage as the gates of NMOS transistors 334 and 335, and NMOS transistors 350–352 having their respective gates controlled at a voltage selected by the common mode feedback circuit 312.

The common mode feedback circuit 312 includes a high-impedance circuit 360 and a signal-sampling circuit 362. The signal-sampling circuit 362 is constructed to sample the common mode voltage of the transconductance cell which, in this instance, is obtained at the differential output port 324a and 324b. The signal-sampling circuit 362 uses a high impedance isolation arrangement of MOS-type transistors and provides a sampled common mode voltage for driving an input port 366 of the high-impedance circuit 360. The high-impedance circuit is constructed to compare the sampled common mode voltage to a reference voltage at node 368 and to provide common mode feedback to the transconductance cell 310.

The high-impedance circuit 360 is substantially another current mirror with two diode-arranged PMOS transistors 370 and 372 passing current along respective current paths to NMOS transistors 374 and 376. The reference voltage at node 368 drives the NMOS transistor 376. The common mode feedback is provided by the high-impedance circuit 360 using the impedance-isolated nodes of its current mirror connected to the gates of the NMOS transistors 350–352 in the transconductance cell 310.

The signal-sampling circuit 362 is a MOS-type transistor arrangement comprising a pair of active NMOS-type transistors 380 and 382 coupled to a node that connects to and drives the high-impedance circuit at the node 366 with the sampled common mode voltage. The gates of the NMOS-type transistors 380 and 382 are interconnected and set at a voltage selected to provide that these NMOS transistors operate in the linear region as does a resistor. The degree of linearity increases with the voltage level controlling the gates of the transistors 380 and 382. The other respective terminals of the NMOS-type transistors 380 and 382 are driven by first and second source followers, transistors 386 and 388, to provide minimal loading effects on the output port 324a and 324b of the transconductance cell 310.

While the above-described common-mode feedback implementation is desirable for many applications, such as digital cellular compliant with CDMA-95, alternative transconductance cells can also be used in combination with various common mode feedback circuits. Example alternatives are described in connection with the following references: Tat C. Choi, et al., *High-Frequency CMOS Switched-Capacitor Filters for Communications Application*, IEEE Journal of Solid-State Circuits, Vol. SC-18, No. 6, 652-664, December 1983; J. Haspeslagh & W. Sansen, *Design Techniques for Fully Differential Amplifiers*, IEEE 1998 Custom Integrated Circuits Conference, 12.2.1–12.2.4; Venugopal Gopinathan et al., *Design Considerations for High-Frequency Continuous-Time Filters and Implementation of an Antialiasing Filter for Digital Video*, IEEE Journal of Solid-State Circuits, Vol. 25, No. 6, 1368–1378, December 1990; and Mihai Banu et al., *Fully Differential Operational Amplifiers with Accurate Output Balancing*, IEEE Journal of Solid-State Circuits, Vol. 23, No. 6, 1410–1414, December 1988.

According to another aspect of the present invention, a particular advantage using the common mode feedback circuit portion of FIG. 3 with the circuit arrangement of FIG. 2b is that the common mode feedback provided by the minimal loading approach of FIG. 3 can be shared between transconductance cells that have shared outputs. Thus, by using one common mode feedback circuit for every pair of such transconductance cells, significant power savings is realized in the elimination of common mode feedback circuitry for every other transconductance cell.

Figure 4:
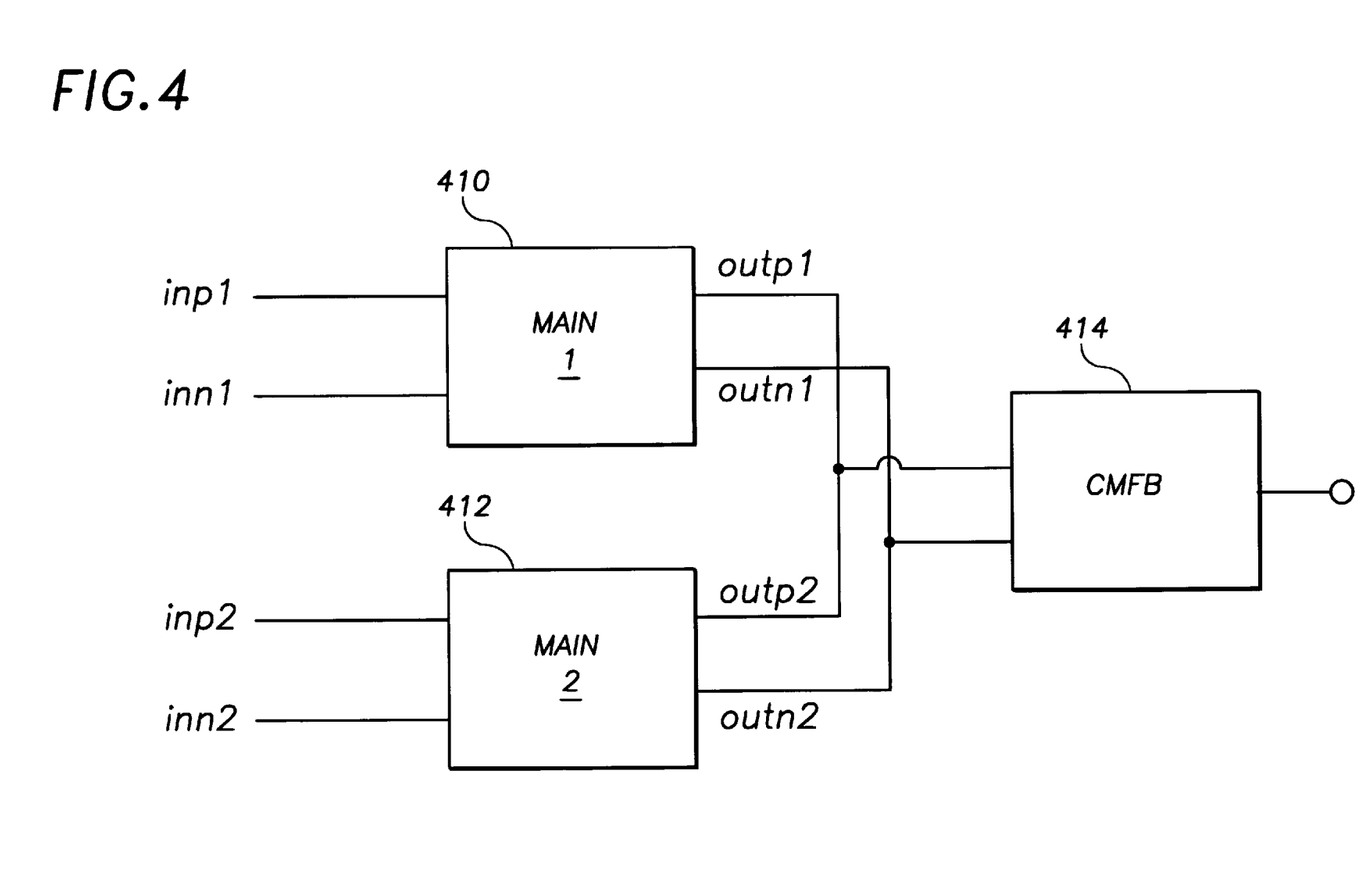
FIG. 4 illustrates an example circuit arrangement for a common mode feedback circuit for transconductance cells with shared outputs, also according to the present invention.

FIG. 4 illustrates an example circuit arrangement for a common mode feedback circuit for transconductance cells with shared outputs. The circuit arrangement of FIG. 4 includes transconductance cells 410 and 412, each receiving separate differential inputs. The outputs of the transconductance cells 410 and 412 are shared, with the positive ports of the differential outputs interconnected and with the negative ports of the differential outputs interconnected. The positive and negative ports of the transconductance cells 410 and 412 map to the differential inputs of the common mode feedback circuit 414 (corresponding to the common mode feedback portion of the circuit arrangement of FIG. 3.

In various other embodiments of the present invention, a signal-filtering circuit includes at least one pair of transconductance cells having shared differential outputs connected to a common mode feedback circuit (such as shown in FIG. 3).

In a more specific embodiment of the present invention, the signal-filtering circuit of FIG. 2b is implemented with the common mode feedback circuit of FIG. 3 in each instance of seven pair of transconductance cells having shared differential outputs. These pairs of transconductance cells are G1/G5, G3/G4, G6/G9, G7/G8, G10/G13, G11/G12, and G14/G15. In this instance, the power savings is measured as a function of the elimination of seven common mode feedback circuits.

Accordingly, the present invention is directed to various embodiments and methods for reducing the power consumption of a signal filter, for example, as is used in connection with a CDMA IS-95 application. In one particular implementation, filter power consumption is reduced by forty-eight percent without degradation of filter sensitivity properties after filter scaling.

The various embodiments described above are provided by way of illustration only and are not intended to limit the invention. Those skilled in the art will readily recognize various modifications and changes that may be made to the present invention. For example, the skilled artisan will appreciate that: the present invention lends itself to applications other than that discussed in connection with FIG. 1; and the circuit arrangement of FIG. 2b may be modified to include a greater or lesser number of transconductance cells for simulating a greater or lesser number of inductance ladder sections. While these and other alterations may not strictly follow the example embodiments and applications illustrated and described herein, the scope of the present invention is set forth in the following claims.

What is claimed is:

1. A gyrator-type signal-filtering circuit arrangement, comprising:
   a plurality of transconductance cells arranged to simulate at least a first inductance ladder section and a second inductance ladder section, the first inductance ladder section adapted to provide a gain of at least two, and each of the first and second inductance ladder sections having at least one associated capacitance value scaled to accommodate a feed-forward and feedback path and having at least one associated transconductance value scaled to accommodate impedance level and signal amplitude of the circuit arrangement.

2. A gyrator-type signal-filtering circuit arrangement, according to claim 1, wherein each of the input and output ports of the transconductance cells is differential.

3. A gyrator-type signal-filtering circuit arrangement, according to claim 1, wherein the first inductance ladder section adapted to provide a gain of two.

4. A gyrator-type signal-filtering circuit arrangement, according to claim 1, wherein the first inductance ladder section adapted to provide a gain of three.

5. A gyrator-type signal-filtering circuit arrangement, according to claim 1, further including a common mode feedback circuit shared by a pair of the transconductance cells, the pair of the transconductance cells having a shared differential output.

6. A gyrator-type signal-filtering circuit arrangement, according to claim 5, wherein the pair of the transconductance cells has a common mode feedback input port adapted to control the common mode voltage at the differential output port of each of the transconductance cells in the pair in response to the common mode feedback.

7. A gyrator-type signal-filtering circuit arrangement, according to claim 6, wherein the common mode feedback circuit includes a high-impedance circuit configured and arranged to compare a sampled common mode voltage to a reference voltage and to provide common mode feedback to the transconductance cell, and includes a signal-sampling circuit configured and arranged to sample a common mode voltage of the transconductance cell using a high impedance isolation arrangement of MOS-type transistors and to provide the sampled common mode voltage for driving an input port of the high-impedance circuit.

8. A gyrator-type signal-filtering circuit arrangement, according to claim 7, wherein the MOS-type transistors include a source-follower circuit having first and second transistors intercoupled to provide the sampled common mode voltage.

9. A gyrator-type signal-filtering circuit arrangement, according to claim 1, wherein the plurality of transconductance cells are arranged to provide an elliptic filter.

10. A gyrator-type signal-filtering circuit arrangement, according to claim 1, wherein the feed-forward and feedback path includes at least three pairs of transconductors respectively separated by first and second nodes.

11. A gyrator-type signal-filtering circuit arrangement, according to claim 10, wherein at least one of the first and second nodes separating said at least three pairs of transconductors has an impedance that is set as though the gain of the first section were unity.

12. A gyrator-type signal-filtering circuit arrangement, comprising:
    means for simulating at least a first inductance ladder section and a second inductance ladder section, the first inductance ladder section adapted to provide a gain of at least two, and each of the first and second inductance ladder sections having at least one associated capacitance value scaled to accommodate a feed-forward and feedback path and having at least one associated transconductance value scaled to accommodate impedance level and signal amplitude of the circuit arrangement; and
    means for providing common mode feedback to the simulation means.

13. A gyrator-type signal-filtering circuit arrangement, according to claim 12, wherein the means for providing common mode feedback includes differential inputs coupled to shared differential output ports of at least one pair of transconductance cells in the simulation means.

14. A gyrator-type signal-filtering circuit arrangement, according to claim 12, wherein the simulation means includes at least one transconductance cell and wherein the means for providing common mode feedback includes a high-impedance circuit configured and arranged to compare a sampled common mode voltage to a reference voltage and to provide common mode feedback to said at least one transconductance cell.

15. A gyrator-type signal-filtering circuit arrangement, according to claim 13, wherein the simulation means includes at least one transconductance cell and wherein the means for providing common mode feedback includes a signal-sampling circuit configured and arranged to sample a common mode voltage of said at least one transconductance cell using a high impedance isolation arrangement of MOS-type transistors.

16. A gyrator-type signal-filtering circuit arrangement, according to claim 13, wherein the simulation means has at least one transconductance cell, and wherein the means for providing common mode feedback includes a high-impedance circuit configured and arranged to compare a sampled common mode voltage to a reference voltage and to provide common mode feedback to said at least one transconductance cell and further includes a signal-sampling circuit configured and arranged to sample a common mode voltage of said at least one transconductance cell using a high impedance isolation arrangement of MOS-type transistors and providing the sampled common mode voltage.

17. A gyrator-type signal-filtering circuit arrangement, according to claim 12, wherein the simulation means has at least one transconductance cell, and wherein the means for providing common mode feedback includes means for comparing a sampled common mode voltage to a reference voltage and for providing common mode feedback to said at least one transconductance cell and further includes means for sampling a common mode voltage of said at least one transconductance cell using a high impedance isolation arrangement of MOS-type transistors and providing the sampled common mode voltage.

18. A gyrator-type signal-filtering circuit arrangement, comprising:
    a plurality of transconductance cells arranged to simulate first, second and third inductance ladder sections and including seven pairs of transconductance cells with each pair having shared differential outputs;
    the first inductance ladder section adapted to provide a gain of two;
    each of inductance ladder sections having an associated capacitance value scaled to accommodate a feed-forward and feedback path that includes transconductance cells in each of the first, second and third inductance ladder sections;
    each of inductance ladder sections further having an associated transconductance value scaled to accommodate impedance level and signal amplitude of the circuit arrangement; and
    at least one common mode feedback circuit adapted to provide common mode feedback to each pair of transconductance cells having shared differential outputs.

19. A gyrator-type signal-filtering circuit arrangement, according to claim 18, wherein the common mode feedback circuit includes a high-impedance circuit configured and arranged to compare a sampled common mode voltage to a reference voltage and to provide common mode feedback to the transconductance cells.

20. A gyrator-type signal-filtering circuit arrangement, according to claim 19, wherein the common mode feedback circuit further includes a signal-sampling circuit configured and arranged to sample a common mode voltage of the transconductance cell using a high impedance isolation arrangement of MOS-type transistors and to provide the sampled common mode voltage.

* * * * *